United States Patent [19]

Murakami et al.

[11] Patent Number: 5,067,551
[45] Date of Patent: Nov. 26, 1991

[54] METHOD FOR MANUFACTURING ALLOY ROD HAVING GIANT MAGNETOSTRICTION

[75] Inventors: Katsuhiko Murakami; Nobuo Yamagami, both of Tokyo; Toshiyuki Nakanishi, Yokosuka; Iwao Nakano, Yokosuka; Keiichi Kobayashi; Takashi Yokhikawa, both of Tokyo, all of Japan

[73] Assignees: NKK Corporation, Tokyo; Japan Marine Science and Technology Center, Yokosuka; Oki Electric Industry Co., Ltd., Tokyo, all of Japan

[21] Appl. No.: 539,603

[22] Filed: Jun. 18, 1990

[30] Foreign Application Priority Data

Jun. 30, 1989 [JP] Japan .................................. 1-168454

[51] Int. Cl.5 ........................ B22D 27/04; C30B 11/14
[52] U.S. Cl. ................................ 164/122.2; 156/616.3; 156/616.4; 148/101; 148/404
[58] Field of Search ............... 156/616.1, 616.3, 616.4, 156/616.41; 148/101, 122, 301, 464; 266/212; 164/122.2

[56] References Cited

U.S. PATENT DOCUMENTS

| | | | |
|---|---|---|---|
| 4,308,474 | 12/1981 | Savage et al. | 148/301 |
| 4,578,145 | 3/1986 | Bartlett et al. | 156/616.41 |
| 4,609,402 | 9/1986 | McMasters | 75/10.11 |

FOREIGN PATENT DOCUMENTS

| | | | |
|---|---|---|---|
| 0282059 | 9/1988 | European Pat. Off. | |
| 53-64798 | 6/1978 | Japan | |
| 62-41792 | 2/1987 | Japan | 156/616.1 |
| 62-109946 | 5/1987 | Japan | |
| 1-242480 | 9/1989 | Japan | 156/616.1 |

OTHER PUBLICATIONS

J. D. Verhoeven et al., "The Growth of Single Crystal Terfenol-D Crystals", Feb. 1987, vol. 18A, pp. 223-231, Metallurgical Transactions A.

Primary Examiner—R. Dean
Assistant Examiner—George Wyszomierski
Attorney, Agent, or Firm—Frishauf, Holtz, Goodman & Woodward

[57] ABSTRACT

A method for manufacturing an alloy rod having giant magnetostriction, which comprises the steps of: supplying a granular or flaky alloy material, which comprises at least two rare earth metals including terbium and dysprosium and at least one transition metal, into a tubular crucible in an inert gas atmosphere kept under a pressure of from 0.2 to 10 atm., arranged in a vertical cylindrical heating furnace; totally melting the alloy material in the crucible in the heating furnace; and then vertically moving any one of the crucible and the heating furnace at a speed of from 0.1 to 5.0 mm/minute in a temperature region of from 1,270° to 1,180° C. of the heating furnace, in which a temperature decreases at a temperature gradient of from 10° to 100° C./cm, to solidify and crystallize the resultant melt of the alloy material in the crucible in a lower portion of the heating furnace, thereby manufacturing an alloy rod having giant magnetostriction, which comprises a single-crystal structure of a unidirectional-solidification structure consistent with the axial line thereof.

14 Claims, 2 Drawing Sheets

METHOD FOR MANUFACTURING ALLOY ROD HAVING GIANT MAGNETOSTRICTION

REFERENCE TO PATENTS, APPLICATIONS AND PUBLICATIONS PERTINENT TO THE INVENTION

As far as we know, there are available the following prior art documents pertinent to the present invention:
(1) Japanese Patent Provisional Publication No.53-64,798 dated June 9, 1978; and
(2) Japanese Patent Provisional Publication No.62-109,946 dated May 21, 1987.

The contents of the prior art disclosed in the above-mentioned prior art documents will be discussed hereafter under the heading of the "BACKGROUND OF THE INVENTION".

FIELD OF THE INVENTION

The present invention relates to a method for manufacturing an alloy rod having giant magnetostriction.

BACKGROUND OF THE INVENTION

An alloy rod having giant magnetostriction such as an amount of magnetostriction of, for example, at least $10^{-3}$ is now attracting the general attention as a material for elements of an electric audio converter, a vibrator, an actuator and the like, and industrialization thereof is leader way. The alloy rod having such large magnetostriction is usually manufactured by heat-treating a rod-shaped alloy material at a temperature slightly lower than the melting point thereof, or totally melting a granular or flaky alloy material and then solidifying the resultant melt of the alloy material into a rod shape.

An alloy comprising at least two rare earth metals including terbium (Tb) and dysprosium (Dy) and at least one transition metal is available as an alloy material for the alloy rod having such giant magnetostriction. As the above-mentioned alloy, an alloy having the following chemical composition is known in the product name of "Terfenol":

$$Tb_X Dy_Y Fe_Z$$

where, X, Y and Z are ratios of the number of atoms, taking respectively the following values:
X: from 0.25 to 0.35,
Y: from 0.60 to 0.80, and
Z: from 1.5 to 2.0.

For the manufacture of an alloy rod having giant magnetorstiction, the following methods are known:
(1) A method for manufacturing an alloy rod having giant magnetostriction, disclosed in Japanese Patent Provisional Publication No.53-64,798 dated June 9, 1978, which comprises the steps of:
subjecting a rod-shaped alloy material having a chemical composition comprising $Tb_{0.28}Dy_{0.72}Fe_2$ to a heat treatment in an inert gas atmosphere, which heat treatment comprises heating said alloy material to a temperature slightly lower than the melting point thereof by means of an annular heater stationarily arranged so as to surround said alloy material while moving said alloy material in the axial direction thereof, thereby manufacturing an alloy rod having giant magnetostriction (hereinafter referred to as the "prior art 1").
(2) A method for manufacturing an alloy rod having giant magnetostriction, disclosed in Japanese Patent Provisional Publication No.62-109,946 dated May 21, 1987, which comprises the steps of:
receiving a rod-shaped alloy material having a chemical composition comprising $Tb_X Dy_{1-X} Fe_{1.5-2.0}$ (X being from 0.27 to 0.35) into a chamber made of quartz in an inert gas atmosphere; moving an annular high-frequency heating coil, arranged so as to surround said chamber, from the lower end toward the upper end of said chamber to heat said rod-shaped alloy material in said chamber in the circumferential direction thereof; continuously moving said heating coil from the lower end toward the upper end of said alloy material in the axial direction thereof to locally and sequentially melt said alloy material in the axial direction thereof; and then, locally and sequentially solidifying the resultant molten section of said alloy material in said chamber, thereby manufacturing an alloy rod having giant magnetostriction (hereinafter referred to as the "prior art 2").
(3) A method, based on the conventional Bridgman method, for manufacturing an alloy rod having giant magnetostriction, which comprises the steps of:
supplying a granular or flaky alloy material, comprising at least two rare earth metals including terbium and dysprosium and at least one transition metal, into a crucible in an inert gas atmosphere placed in a vertical cylindrical heating furnace; totally melting said alloy material in said crucible in said heating furnace; and then, vertically moving any one of said crucible and said heating furnace to solidify and crystallize the resultant melt of said alloy material in said crucible at a lower portion of said heating furnace thereby manufacturing an alloy rod having giant magnetostriction (hereinafter referred to as the "prior art 3").

The above-mentioned prior art 1 has the following problems: A rod-shaped alloy material having a chemical composition comprising $Tb_X Dy_Y Fe_Z$ is brittle in general. Therefore, an alloy rod having giant magnetostriction manufactured by applying a heat treatment to the rod-shaped alloy material having such a chemical composition is also brittle and easily cracks. In addition, the heat treatment applied to the rod-shaped alloy material requires a long period of time, thus leading to a low manufacturing efficiency.

The above-mentioned prior art 2 has the following problems: When locally and sequentially melting the rod-shaped alloy material in the axial direction thereof and then locally and sequentially solidifying the resultant molten section of the alloy material, the molten section is held between the not yet melted alloy material and the melted and solidified alloy rod under the effect of surface tention of the molten section. However, the $Tb_X Dy_Y Fe_Z$ alloy in a molten state has only a small surface tension, with a high density. When a diameter of the alloy material is large, therefore, the molten section between the not yet melted alloy material and the melted and solidified alloy rod falls down in the form of drops, thus making it impossible to manufacture the alloy rod. According to the experience of the inventors, a diameter of the alloy rod capable of being stably manufactured in accordance with this method is 10 mm maximum even when adjusting the frequency and the output of the highfrequency heating coil for melting the alloy material. There is at present a demand for an alloy rod having giant magnetostriction, which has a large diameter of over 10 mm, for use as elements for an electric audio converter, a vibrator, an actuator and the like having a large output. However, such a large-diameter alloy rod having giant magnetostriction cannot be manufactured by the prior art 2.

The above-mentioned prior art 3 has the following problems: According to the prior art 3, it is possible to manufacture an alloy rod having a large diameter of over 10 mm. However, in order to manufacture an alloy rod having giant magnetostriction from an alloy material comprising at least two rare earth metals including terbium and dysprosium and at least one transition metal in accordance with the prior art 3, it is necessary to solidify and crystallize the melt of the alloy material in the crucible so as to achieve a single-crystal structure or a unidirectional-solidification structure consistent with the axial line thereof. However, it is not necessarily easy to solidify and crystallize the melt of the alloy material in the crucible so as to achieve a single-crystal structure or a unidirectional-solidification structure consistent with the axial line thereof. According to the prior art 3, therefore, it is difficult to stably manufacture an alloy rod having giant magnetostriction at a high efficiency.

Under such circumstances, there is a strong demand for the development of a method for manufacturing stably at a high efficiency an alloy rod having a large diameter of over 10 mm and giant magnetostriction without causing cracks, but such a method has not as yet been proposed.

SUMMARY OF THE INVENTION

An object of the present invention is therefore to provide a method for manufacturing stably at a high efficiency, an alloy rod having a large diameter of over 10 mm and giant magnetostriction without causing cracks.

In accordance with one of the features of the present invention, there is provided a method for manufacturing an alloy rod having, giant magnetostriction, which comprises the steps of:

supplying a granular or flaky alloy material, which comprises at least two rare earth metals including terbium and dysprosium and at least one transition metal, into a tubular crucible in an inert gas atmosphere, arranged in a substantially vertical cylindrical heating furnace;

totally melting said alloy material in said crucible in said heating furnace, and then vertically moving any one of said crucible and said heating furnace to solidify and crystallize the resultant melt of said alloy material in said crucible in a lower portion of said heating furnace, thereby manufacturing an alloy rod having giant magnetostriction, which comprises a single-crystal structure or a unidirectional-solidification structure consistent with the axial line thereof; characterized in that:

said inert gas atmosphere in said crucible is kept under a pressure within a range of from 0.2 to 10 atm.; and any one of said crucible and said heating furnace is moved at a speed within a range of from 0.1 to 5.0 mm/minute in a temperature region of from 1,270° to 1,180° C. of said heating furnace, in which a temperature decreases at a temperature gradient within a range of from 10° to 100° C./cm, to crystallize said melt of said alloy material in said crucible.

DETAILED DESCRIPTION OF PREFERRED EMBODIMENTS

From the above-mentioned point of view, extensive studies were carried out to develop a method for manufacturing stably at a high efficiency an alloy rod having a large diameter of over 10 mm and giant magnetostriction without causing cracks. As a result, the following findings were obtained: It is possible to stably manufacture at a high efficiency without causing cracks an alloy rod having giant magnetostriction, which comprises a single-crystal structure or a unidirectional-solidification structure consistent with the axial line thereof, by supplying a granular or flaky alloy material, which comprises at least two rare earth metals including terbium and dysprosium and at least one transition metal, into a tubular crucible in an inert gas atmosphere kept under a pressure of from 0.2 to 10 atm., arranged in a vertical cylindrical heating furnace; totally melting said alloy material in said crucible in said heating furnace; and then vertically moving any one of said crucible and said heating furnace at a speed of from 0.1 to 5 mm/minute in a temperature region of from 1,270° to 1,180° C. of said heating furnace, in which a temperature decreases at a temperature gradient of from 10° to 100° C./cm, to solidify and crystallize the resultant melt of said alloy material in said crucible in a lower portion of said heating furnace.

The present invention was made on the basis of the above-mentioned findings. Now, the method of the present invention for manufacturing an alloy rod having giant magnetostriction is described with reference to the drawings.

Figure 1:
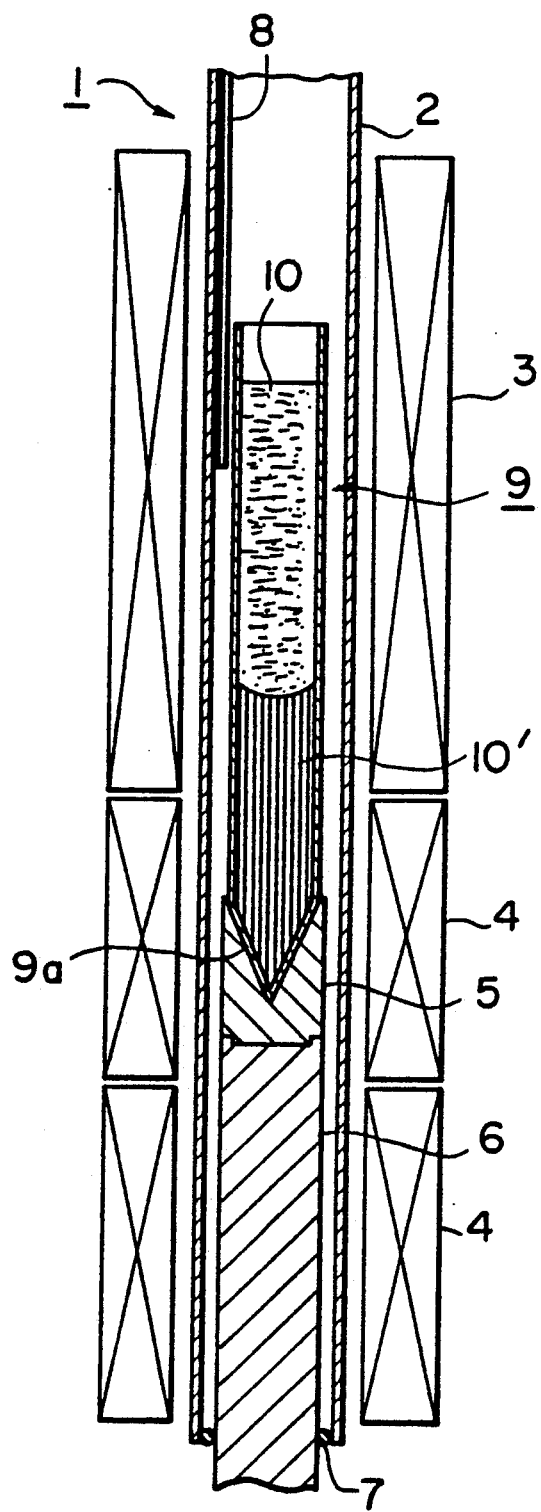
FIG. 1 is an elevational view partially in cross section illustrating an embodiment of the apparatus used in the method of the present invention.

FIG. 1 is a schematic descriptive view illustrating an embodiment of the apparatus used in the method of the present invention. As shown in FIG. 1, a stationarily arranged cylindrical heating furnace 1 comprises a substantially vertical cylindrical furnace body 2, a main heater 3 arranged so as to surround an upper portion of the furnace body 2, and two sub-heaters 4 arranged directly below the main heater 3 so as to surround a lower portion of the furnace body 2. Each of the main heater 3 and the sub-heaters 4 comprises, for example, an electric-resistance heater. A tubular crucible 9 made of ceramics is supported substantially vertically in the furnace body 2 of the heating furnace 1 by means of a crucible support 5 made, for example, of boron nitride fitted to the upper end of a substantially vertical crucible supporting shaft 6. The crucible supporting shaft 6 projects downwardly through a sealing member 7 from the lower end of the furnace body 2, and is vertically movable by means of a driving mechanism not shown. A thermocouple 8 for measuring a temperature in the interior of the furnace body 2 is substantially vertically inserted into the interior of an upper portion of the furnace body 2, which is surrounded by the main heater 3. The upper end of the furnace body 2 is capable of being opened and closed by means of a cover not shown.

A granular or flaky alloy material, comprising at least two rare earth metals including terbium and dysprosium and at least one transition metal, is supplied into the crucible 9. The crucible 9 thus supplied with the alloy material is positioned by means of the crucible supporting shaft 6 in the upper portion of the furnace body 2 of the heating furnace 1, which is surrounded by the main heater 3. Then, the crucible 9 is heated by means of the main heater 3 to totally melt the alloy material in the crucible 9. Then, the crucible 9 is downwardly moved in the vertical direction by the action of the crucible supporting shaft 6 to solidify and crystallize the resultant melt 10 of the alloy material in the crucible 9 at a position in the furnace body 2, which corresponds to a lower portion of the main heater 3. An alloy rod is thus manufactured. In place of arranging the heating furnace 1 in a stationary manner and moving the crucible 9 downwardly in the vertical direction, the crucible 9 may be arranged in a stationary manner and the heating furnace 1 may be moved upwardly in the vertical direction.

In order that the thus manufactured alloy rod has giant magnetorstiction, the alloy rod should have a single-crystal structure or a unidirectional-solidification structure consistent with the axial line thereof. The conditions for the method of the present invention for stably manufacturing, at a high efficiency without causing cracks, the alloy rod having giant magnetostriction, which comprises a single-crystal structure or a unidirectional-solidification structure consistent with the axial line thereof, are described below.

A temperature gradient in the temperature region, in which the melt 10 of the alloy material comprising at least two rare earth metals including terbium and dysprosium and at least one transition metal is crystallized, and a moving speed of any one of the crucible 9 and the heating furnace 1 in the above-mentioned temperature region, exert an important effect on the crystal structure of a solidified mass 10' of the alloy material. A crystallization start temperature of the melt 10 of the alloy material comprising at least two rare earth metals including terbium and dysprosium and at least one transition metal is within the range of from about 1,225° to about 1,245° C., and a secondary peritectic temperature of the melt 10 is about 1,185° C. In the present invention, therefore, a downward temperature gradient in the temperature region of from 1,270° to 1,180° C. of the furnace body 2 of the heating furnace 1 is limited within a range of from 10° to 100° C./cm, and a moving speed of any one of the crucible 9 and the heating furnace 1 in the temperature region, in which a temperature decreases at such a temperature gradient, is limited within a range of from 0.1 to 5.0 mm/minute.

With a temperature gradient of under 10° C./cm in the above-mentioned temperature region, the moving speed of any one of the crucible 9 and the heating furnace 1 must be an extra-low speed of under 0.1 mm/minute, thus deteriorating productivity and making it impossible to manufacture an alloy rod at a high efficiency. Imparting a temperature gradient of over 100° C./cm to the abovementioned temperature region is, on the other hand, difficult from equipment considerations. With a moving speed of under 0.1 mm/minute of any one of the crucible 9 and the heating furnace 1 in the above-mentioned temperature region, productivity is low and an alloy rod cannot be manufactured at a high efficiency, as described above. With a moving speed of over 5.0 mm/minute of any one of the crucible 9 and the heating furnace 1 in the abovementioned temperature region, on the other hand, it is difficult for the solidified mass 10' of the alloy material in the crucible 9 to have a single-crystal structure or a unidirectional-solidification structure consistent with the axial line thereof. The temperature region of the furnace body 2 of the heating furnace 1, in which a temperature decreases at the above-mentioned temperature gradient, is formed at a position in the furnace body 2, which corresponds to a lower portion of the main heater 3.

An alloy comprising at least two rare earth metals including terbium and dysprosium and at least one transition metal is very active. Therefore, the interior of the crucible 9, in which the granular or flaky alloy material comprising such an active alloy is supplied and melted, and the melt 10 thereof is solidified, should be maintained in an inert gas atmosphere kept under a pressure within a range of from 0.2 to 10 atm. In the apparatus shown in FIG. 1, the interior of the heating furnace 1 is maintained in an inert gas atmosphere kept under a pressure within the above-mentioned range. With a pressure of the inert gas atmosphere of under 0.2 atm., volatile dysprosium in the melt 10 of the alloy material evaporates, thus causing the problem of changes in the chemical composition of the solidified mass 10'. A pressure of the inert gas atmosphere of over 10 atm., on the other hand, causes safety problems in operation.

As shown in FIG. 1, at least one sub-heater 4 should preferably be arranged directly below the main heater 3 so as to surround the lower portion of the furnace body 2. By thus arranging at least one sub-heater 4, it is possible to prevent occurrence of cracks in the solidified mass 10' during solidification of the melt 10 of the alloy material in the crucible 9, melted by means of the main heater 3.

A preferable chemical composition of the alloy material for manufacturing an alloy rod having giant magnetostriction is as follows:

$$Tb_XDy_YFe_Z$$

where, X, Y, and Z are ratios of the number of atoms, taking respectively the following values:
  X: from 0.25 to 0.35,
  Y: from 0.60 to 0.80, and
  Z: from 1.5 to 2.0.

A bottom 9a of the crucible 9 should preferably be formed into an inverted cone shape having an angle within a range of from 30° to 100°. When the bottom 9a of the crucible 9 is thus formed into an inverted cone shape, it is possible to promote production of crystal nuclei and growth of a single-crystal structure. An angle of under 30° of the inverted cone shape of the bottom 9a leads to an unnecessarily long bottom 9a. An inverted cone-shaped solidified mass 10' solidified in such a long inverted cone-shaped bottom 9a has to be trimmed away. An angle of under 30° of the inverted cone shape of the bottom 9a therefore increases the amount of trimming of the solidified mass 10', thus leading to a lower product yield. An angle of over 100° of the inverted cone shape of the bottom 9a, on the other hand, makes it impossible to promote production of crystal nuclei and growth of a single-crystal structure, as described above.

It is desirable to form an elongated vertical recess not shown having, for example, a diameter of from 1 to 5 mm and a depth of from 10 to 50 mm, on the bottom 9a of the crucible 9, formed into the inverted cone shape, and to fill the thus formed recess with a seed crystal having the same chemical composition as that of the alloy material and the <111> orientation or the <112> orientation. Filling the recess with the seed crystal promotes growth of crystals having the <111> orientation or the <112> orientation excellent in magnetostrictive property in the alloy rod. When the melt 10 of the alloy material comprising at least two rare earth metals including terbium and dysprosium and at least one transition metal is solidified, crystals having the <112> orientation preferentially grow. The crystals having the <112> orientation have a magnetostrictive property closely approximating to that of crystals having the <111> orientation, which have the most excellent magnetostrictive property. Therefore, an alloy rod having almost satisfactory giant magnetostriction is available without using the above-mentioned seed crystal.

An alloy comprising at least two rare earth metals including terbium and dysprosium and at least one transition metal is very active as described above. Therefore, the crucible 9, in which the granular or flaky alloy material comprising such an active alloy is melted and the melt 10 of the alloy material is solidified, should preferably be formed of ceramics mainly comprising at least one of quartz ($SiO_2$), pyrolytic boron nitride (P-BN), calcium oxide (CaO), yttrium oxide ($Y_2O_3$), zirconium oxide ($ZrO_2$), aluminum oxide ($Al_2O_3$) and magnesium oxide (MgO).

As described above, the granular or flaky alloy material, comprising at least two rare earth metals including terbium and dysprosium and at least one transition metal, is supplied into the tubular crucible 9 in an inert gas atmosphere kept under a pressure of from 0.2 to 10 atm., arranged in the furnace body 2 of the heating furnace 1. The alloy material in the crucible 9 is totally melted in the furnace body 2. Then, the crucible 9 is downwardly moved in the vertical direction at a speed of from 0.1 to 5 mm/minute in a temperature region of from 1,270° to 1,180° C. of the furnace body 2, in which a temperature decreases at a temperature gradient of from 10° to 100° C./cm, to solidify and crystallize the resultant melt 10 of the alloy material in the crucible 9 at a position in the furnace body 2, which corresponds to the lower portion of the main heater 3. As a result, the solidified mass 10' of the alloy material has a single-crystal structure or a unidirectional-solidification structure consistent with the axial thereof, thus an alloy rod having giant magnetostriction is manufactured.

Now, the method the present invention for manufacturing an alloy rod having giant magnetostriction is described more in detail by means of an example.

EXAMPLE

An alloy rod having magnetostriction was manufactured as follows with the use of the apparatus as shown in FIG. 1. The crucible 9 made of ceramics mainly comprising pyrolytic boron nitride (P-BN), having the bottom 9a formed into an inverted cone shape with an angle of 60°, was placed on the crucible support 5 of the crucible supporting shaft 6. The crucible 9 had the following dimensions:
  Inside diameter of the crucible 9:32 mm,
  Outside diameter of the crucible 9:34 mm, and
  Height of the crucible 9:230 mm.

The interior of the furnace body 2 of the heating furnace 1 was maintained in an argon gas atmosphere kept under a pressure of 2 atm., and a flaky alloy material having a chemical composition comprising $Tb_{0.3}Dy_{0.7}Fe_{1.9}$ was supplied into the crucible 9.

Figure 2:
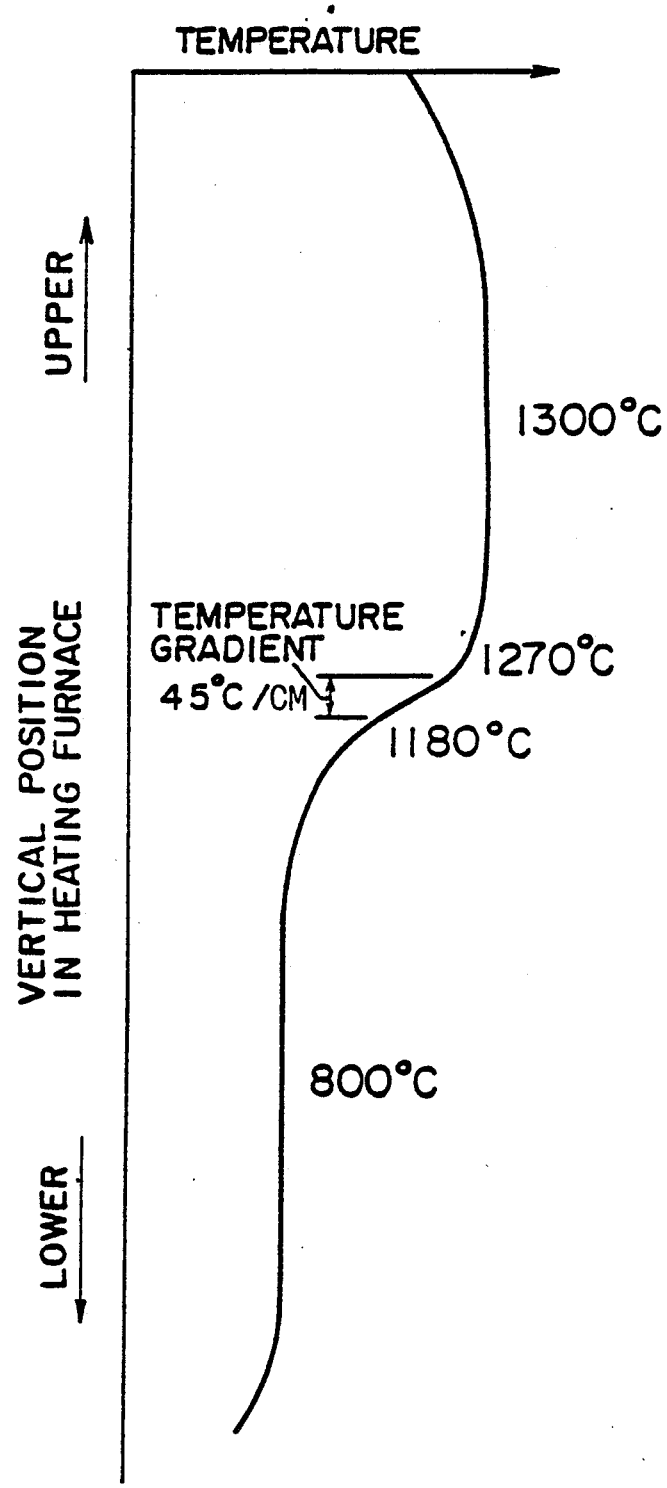
FIG. 2 is a graph illustrating a temperature distribution in the vertical direction in a heating furnace of the apparatus shown in FIG. 1, used in the method of the present invention.

Temperature regions having respective temperature distributions as described below were formed in the furnace body 2 of the heating furnace 1 by means of the main heater 3 arranged so as to surround the upper portion of the furnace body 2 and the two sub-heaters 4 arranged directly below the main heater 3 so as to surround the lower portion of the furnace body 2. FIG. 2 is a graph illustrating a temperature distribution in the vertical direction in the furnace body 2 of the heating furnace 1 of the apparatus shown in FIG. 1, used in the method of the present invention. As shown in FIG. 2, a first temperature region of about 1,300° C. for melting the alloy material, and a second temperature region of from 1,270° to 1,180° C., directly below the first temperature region, in which a temperature decreases at a temperature gradient of 45° C./cm, for solidifying and crystallizing the melt 10 of the alloy material, were formed by means of the main heater 3 in the upper portion of the interior of the furnace body 2 of the heating furnace 1. Furthermore, a third temperature region of about 800° C., directly below the second temperature region, for preventing occurrence of cracks in the solidified mass 10' during solidification of the melt 10 of the alloy material, was formed by means of the two subheaters 4 in the lower portion of the interior of the furnace body 2 of the heating furnace 1. The temperature in the upper portion of the interior of the furnace body 2 of the heating furnace 1 was measured by means of the thermocouple 8 to adjust the output of the main heater 3 so that the temperature in the upper portion of the interior of the furnace body 2 was kept at the abovementioned temperature of about 1,300° C.

The crucible 9 was positioned by means of the crucible supporting shaft 6 in the first temperature region of about 1,300° C. of the furnace body 2 of the heating furnace 1, and the above-mentioned alloy material in the crucible 9 was heated at a temperature of 1,300° C. for one hour to totally melt the alloy material. Then, the crucible 9 was moved downwardly in the vertical direction at a speed of 1.5 mm/minute in the second temperature region of from 1,270° to 1,180° C. of the furnace body 2, in which a temperature decreased at a temperature gradient of 45° C./cm, to solidify and crystallize the resultant melt 10 of the alloy material in the crucible 9. Then, the resultant solidified mass 10' of the alloy material in the crucible 9 was slowly cooled in the third temperature region of about 800° C. of the furnace body 2 while continuing the above-mentioned movement of the crucible 9, whereby an alloy rod having a diameter of 32 mm and having giant magnetostriction as represented by an amount of magnetostriction of at least $10^{-3}$, which comprised a single-crystal structure having the <112> orientation, was manufactured at a high frequency without causing cracks.

According to the method of the present invention, as described above in detail, it is possible to stably manufacture at a high efficiency an alloy rod having a giant diameter of over 10 mm and giant magnetostriction without causing cracks, thus providing industrially useful effects.

What is claimed is:

1. A method for manufacturing an alloy rod having giant magnetostriction, which comprises the steps of:
  supplying a granular or flaky alloy material, which material comprises at least two rare earth metals comprising terbium and dysprosium and at least one transition metal, into a tubular crucible in an inert gas atmosphere at a pressure of 0.2 to 10 atmospheres, said tubular crucible being arranged in a substantially vertical cylindrical heating furnace;

totally melting said alloy material in said crucible in said heating furnace, and then vertically moving any one of said crucible and said heating furnace at a speed of 0.1 to 5 mm/minute, said moving being carried out in a temperature of 1,270 to 1,180° C. in said heating furnace, in which temperature region the temperature decreases at a temperature gradient of 10 to 100° C./m to solidify and crystallize the resultant melt of said alloy material in said crucible in a lower portion of said heating furnace, thereby manufacturing an alloy rod having a giant magnetostriction, which comprises a single-crystal structure or a unidirectional-solidification structure in the axial direction thereof 2. The method as claimed in claim 1, wherein: said alloy is material melted in said crucible in a cylindrical furnace body having a main heater surrounding an upper portion of said furnace body, and at least one sub-heater arranged directly below said main heater and surrounding a lower portion of said furnace body.

3. The method as claimed in claim 1, wherein:
said heating furnace is stationarily arranged, and said crucible is downwardly moved in the vertical direction.

4. The method as claimed in claim 3, further comprising making said heating furnace so as to comprise a cylindrical furnace body, a main heater surrounding an upper portion of said furnace body, and at least one sub-heater arranged directly below said main heater and surrounding a lower portion of said furnace body;

forming a bottom of said crucible into an inverted cone shape having an angle of 30° to 100°;

forming an elongated vertical recess on said bottom of said crucible, filling said recess with a seed crystal having the same chemical composition as that of said alloy material and having a <111> orientation or a <112> orientation;

forming said crucible of ceramics selected from the groups consisting of at least one of quartz, pyrolytic boron nitride, calcium oxide, yttrium oxide, zircon oxide, aluminum oxide and magnesium oxide; and said alloy material having a chemical composition comprising:

$Tb_X Dy_Y Fe_Z$ where, X, Y and Z are ratios of the number of atoms, having respectively the following values;
X: from 0.25 to 0.35,
Y: from 0.60 to 0.80, and
Z: from 1.5 to 2.0.

5. The method as claimed in claim 1, wherein:
said crucible is stationarily arranged, and said heating furnace is upwardly moved in the vertical direction.

6. The method as claimed in claim 5, further comprising making said heating furnace so as to comprise a cylindrical furnace body, a main heater surrounding an upper portion of said furnace body, and at least one sub-heater arranged directly below said main heater and surrounding a lower portion of said furnace body;

forming a bottom of said crucible into an inverted cone shape having an angle of 30° to 100°;

forming an elongated vertical recess on said bottom of said crucible, filling said recess with a seed crystal having the same chemical composition as that of said alloy material and having a <111> orientation or a <112> orientation;

forming said crucible of ceramics selected from the group consisting of at least one of quartz, pyrolytic boron nitride, calcium oxide, yttrium oxide, zirconium oxide, aluminum oxide and magnesium oxide; and said alloy material having a chemical composition comprising:

$Tb_X Dy_Y Fe_Z$ where, X, Y and Z are ratios of the number of atoms, having respectively the following values;
X: from 0.25 to 0.35,
Y: from 0.60 to 0.80, and
Z: from 1.5 to 2.0.

7. The method as claimed in claim 1, wherein:
said alloy material has a chemical composition comprising:

$Tb_X Dy_Y Fe_Z$ where, X, Y and Z are ratios of the number of atoms, having respectively the following values:
X: from 0.25 to 0.35,
Y: from 0.60 to 0.80, and
Z: from 1.5 to 2.0.

8. The method as claimed in claim 7, wherein said alloy material has the chemical composition $Tb_{0.3}Dy_{0.7}Fe_{1.9}$.

9. The method as claimed in claim 8, wherein the temperature gradient is 45° C./cm.

10. The method as claimed in claim 9, wherein the moving speed is 1.5 mm/minute.

11. The method as claimed in claim 1, wherein:
said alloy material is melted in said crucible having a bottom forming an inverted cone shape having an angle of 30° to 100°.

12. The method as claimed in claim 11, wherein:
said alloy material is melted in said crucible having an elongated vertical recess on said bottom of said crucible, and filling said recess with a seed crystal having the same composition as that of said alloy material and having a <111> orientation or a <112> orientation.

13. The method as claimed in claim 1, wherein:
said alloy material is melted in
said crucible, said crucible being made of ceramics selected from the group consisting of at least one of quartz ($SiO_2$), pyrolytic boron nitride (P-BN), calcium oxide (CaO), yttrium oxide ($Y_2O_3$), zirconium oxide ($ZrO_2$), aluminum oxide ($Al_2O_3$) and magnesium oxide (MgO).

14. The method as claimed in claim 1, wherein the transition metal is Fe.

* * * * *